(12) United States Patent  
Park et al.

(10) Patent No.: US 8,381,677 B2
(45) Date of Patent: Feb. 26, 2013

(54) PREVENTION OF FILM DEPOSITION ON PECVD PROCESS CHAMBER WALL

(75) Inventors: Beom Soo Park, San Jose, CA (US); Robin L. Tiner, Santa Cruz, CA (US); Soo Young Choi, Fremont, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1253 days.

(21) Appl. No.: 11/955,575

(22) Filed: Dec. 13, 2007

(65) Prior Publication Data

US 2008/0187682 A1  Aug. 7, 2008

Related U.S. Application Data

(60) Provisional application No. 61/007,905, filed on Dec. 20, 2006, provisional application No. 61/007,906, filed on Dec. 20, 2006.

(51) Int. Cl.  
*C23C 16/00* (2006.01)  
*C23C 16/50* (2006.01)  
*C23F 1/00* (2006.01)  
*H01L 21/306* (2006.01)

(52) U.S. Cl. ............ 118/723 E; 118/715; 118/722; 118/723 R; 118/728; 156/345.1; 156/345.43; 156/345.47; 156/345.51

(58) Field of Classification Search .......... 118/715, 118/728, 729, 730, 731, 732; 156/345.51, 156/345.52, 345.53, 345.54, 345.55  
See application file for complete search history.

(56) References Cited

U.S. PATENT DOCUMENTS

| | | |
|---|---|---|
| 4,016,389 A | 4/1977 | White |
| 4,036,665 A | 7/1977 | Barr et al. |
| 4,399,014 A | 8/1983 | Engle |
| 4,841,925 A | 6/1989 | Ward |
| 4,998,178 A | 3/1991 | Weiss |
| 5,140,812 A | 8/1992 | Cornelison et al. |
| 5,171,491 A | 12/1992 | Kim et al. |
| 5,232,671 A | 8/1993 | Brunson et al. |
| 5,272,876 A | 12/1993 | Sheller |
| 5,384,099 A | 1/1995 | Sheller |
| 5,476,501 A | 12/1995 | Stewart et al. |
| 5,522,937 A | 6/1996 | Chew et al. |
| 5,593,550 A | 1/1997 | Stewart et al. |
| 5,693,196 A | 12/1997 | Stewart et al. |
| 5,830,329 A | 11/1998 | Stewart et al. |
| 5,846,332 A | 12/1998 | Zhao et al. |
| 5,959,586 A | 9/1999 | Benham et al. |
| 5,964,947 A | 10/1999 | Zhao et al. |
| 6,024,044 A | 2/2000 | Law et al. |
| 6,049,736 A | 4/2000 | Stewart et al. |

(Continued)

OTHER PUBLICATIONS

PCT International Search Report and Written Opinion dated Aug. 6, 2008 for International Application No. PCT/US2007/87597.

*Primary Examiner* — Parviz Hassanzadeh  
*Assistant Examiner* — Tiffany Nuckols  
(74) *Attorney, Agent, or Firm* — Patterson & Sheridan, LLP

(57) ABSTRACT

A method and apparatus for processing a substrate are provided. The chamber body comprises a chamber bottom and a sidewall having a slit valve. A substrate support comprising a support body is disposed in the chamber body. A first end of at least one wide RF ground strap is coupled with the support body and a second end of at least one RF ground strap is coupled with the chamber bottom. At least one extension bar is positioned along a peripheral edge of the support body. The method comprises providing a processing chamber having a slit valve and a substrate support, providing RF power to a distribution plate disposed over the substrate support, flowing gas through the distribution plate, plasma processing a substrate disposed on the substrate support, and reducing the generation of plasma adjacent to the slit valve.

24 Claims, 12 Drawing Sheets

U.S. PATENT DOCUMENTS

| | | | |
|---|---|---|---|
| 6,053,171 | A | 4/2000 | Stewart et al. |
| 6,063,441 | A | 5/2000 | Koai et al. |
| 6,101,973 | A | 8/2000 | Stewart et al. |
| 6,221,221 | B1 * | 4/2001 | Al-Shaikh et al. ....... 204/298.02 |
| 6,228,229 | B1 | 5/2001 | Raaijmakers et al. |
| 6,263,249 | B1 | 7/2001 | Stewart et al. |
| 6,264,812 | B1 | 7/2001 | Raaijmakers et al. |
| 6,270,859 | B2 | 8/2001 | Zhao et al. |
| 6,297,595 | B1 | 10/2001 | Stimson et al. |
| 6,424,141 | B1 | 7/2002 | Hollman et al. |
| 6,549,811 | B2 | 4/2003 | Stewart et al. |
| 6,700,397 | B2 | 3/2004 | Hollman et al. |
| 6,726,805 | B2 | 4/2004 | Brown et al. |
| 6,753,592 | B1 | 6/2004 | Husher |
| 6,773,562 | B1 | 8/2004 | Inagawa et al. |
| 6,803,756 | B2 | 10/2004 | Hollman et al. |
| 6,822,290 | B2 | 11/2004 | Husher |
| 6,830,624 | B2 | 12/2004 | Janakiraman et al. |
| 6,875,700 | B2 | 4/2005 | Kanakasabapathy et al. |
| 6,917,195 | B2 | 7/2005 | Hollman |
| 6,933,442 | B2 | 8/2005 | Franks, Jr. |
| 7,060,545 | B1 | 6/2006 | Husher |
| 7,083,702 | B2 | 8/2006 | Blonigan et al. |
| 7,100,532 | B2 | 9/2006 | Pribyl |
| 7,101,466 | B2 | 9/2006 | Gupta et al. |
| 7,112,536 | B2 | 9/2006 | Markunas et al. |
| 7,138,579 | B2 * | 11/2006 | Megason et al. ................ 174/51 |
| 2003/0211757 | A1 | 11/2003 | Gondhalekar et al. |
| 2004/0250955 | A1 * | 12/2004 | Blonigan et al. ......... 156/345.51 |
| 2005/0056370 | A1 | 3/2005 | Brown et al. |
| 2005/0255257 | A1 | 11/2005 | Choi et al. |
| 2006/0060138 | A1 | 3/2006 | Keller et al. |
| 2006/0060302 | A1 | 3/2006 | White et al. |

\* cited by examiner

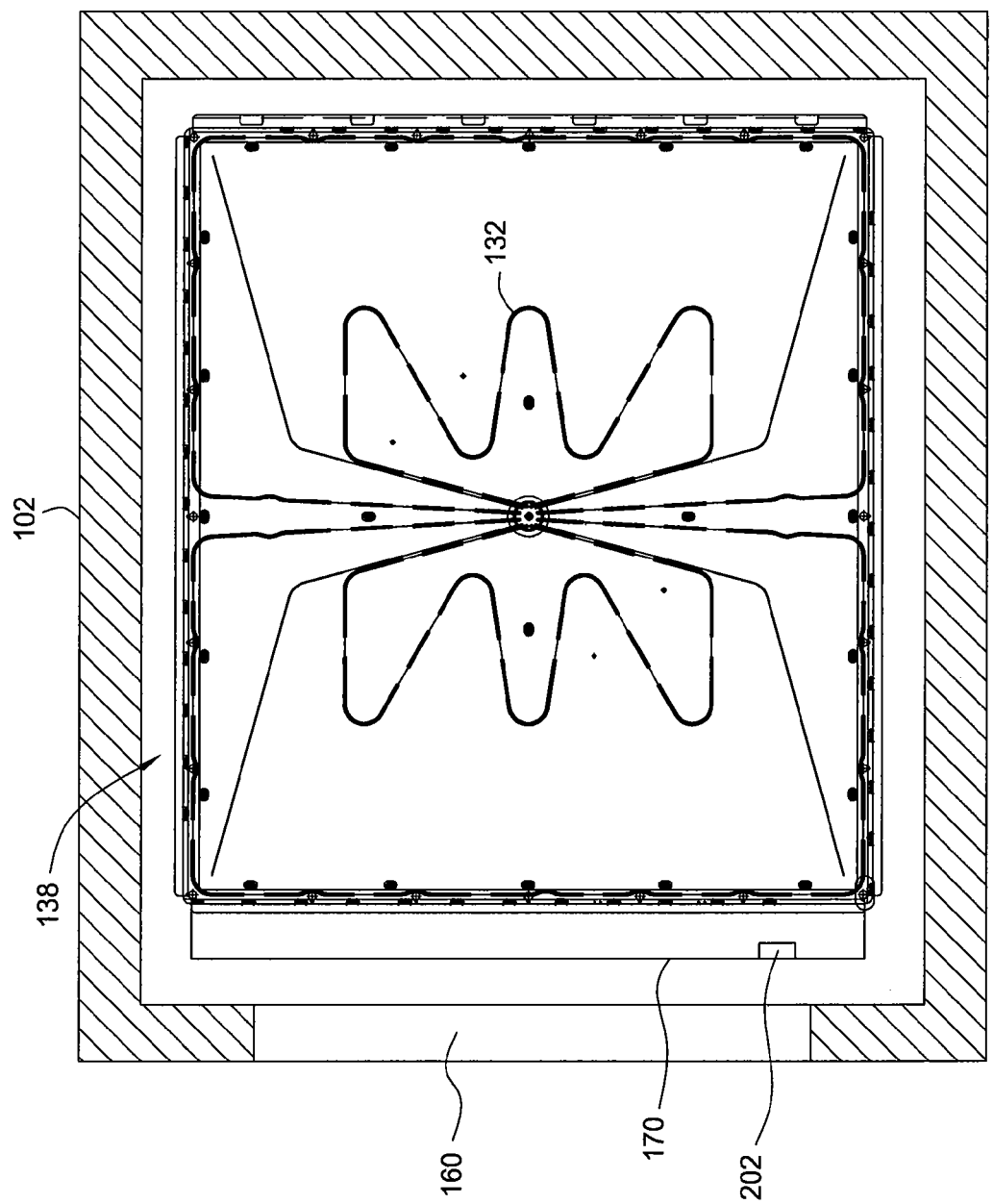

PREVENTION OF FILM DEPOSITION ON PECVD PROCESS CHAMBER WALL

CROSS-REFERENCE TO RELATED APPLICATIONS

This application claims benefit of U.S. Provisional Patent Application No. 61/007,905, filed Dec. 20, 2006 (previously Ser. No. 11/613,924), and U.S. Provisional Patent Application No. 61/007,906, filed Dec. 20, 2006 (previously Ser. No. 11/613,934), both of which are herein incorporated by reference.

BACKGROUND OF THE INVENTION

1. Field of the Invention

Embodiments of the present invention generally relate to a method and apparatus for plasma processing a substrate, more particularly, a plasma processing chamber having a wide RF ground strap and/or a substrate extension bar and methods for using the same.

2. Description of the Related Art

PECVD is generally employed to deposit a thin film on a substrate or a semiconductor wafer. PECVD is generally accomplished by introducing a precursor gas or gases into a vacuum chamber. The precursor gas is typically directed through a distribution plate typically fabricated from aluminum situated near the top of the chamber. Plasma is formed in the vacuum chamber. The precursor gas reacts with the plasma to deposit a thin layer of material on the surface of the substrate that is positioned on a substrate support. Deposition by-products produced during the reaction are often deposited on the slit valve tunnel and the chamber wall of the vacuum chamber. The deposited film on the chamber wall and the slit valve tunnel is relatively porous due to non-uniform gas flow and plasma density. This porous film accumulates on the chamber walls and may become a source of contamination in the chamber producing flakes and particles during prolonged durations of deposition.

Therefore, there is a need for an improved plasma processing chamber and method for using the same.

SUMMARY OF THE INVENTION

Embodiments of the present invention generally relate to a method and apparatus for plasma processing a substrate, and more particularly, a plasma processing chamber having a wide RF ground strap and/or a substrate extension bar and methods for using the same.

Embodiments of the invention generally provide a substrate processing chamber comprising a chamber body. The chamber body comprises a chamber bottom and a sidewall having a slit valve. A substrate support comprising a support body is disposed in the chamber body. A first end of at least one wide RF ground strap is coupled with the support body and a second end of at least one RF ground strap is coupled with the chamber bottom. At least one extension bar is positioned along a peripheral edge of the support body.

In another embodiment a substrate processing chamber comprising a chamber body is provided. The chamber body comprises a chamber bottom and a sidewall. A substrate support comprising a support body disposed in the chamber body is provided. A first end of at least one wide RF ground strap is coupled with the support body and a second end of at least one RF ground strap is coupled with the chamber bottom.

In yet another embodiment a substrate processing chamber comprising a chamber body with a sidewall is provided. A substrate support is positioned in the chamber body. At least one extension bar is positioned along a peripheral edgy of the substrate support. In one embodiment, the sidewall has a slit valve and the at least one extension bar is positioned adjacent to the sidewall.

In yet another embodiment a method of processing a substrate is provided. The method comprises providing a processing chamber having a slit valve and a substrate support. RF power is provided to a distribution plate disposed over the substrate support. Gas is flowed through the distribution plate. A substrate disposed on the substrate support is plasma processed. The generation of plasma adjacent to the slit valve is reduced.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2 is a top view of one embodiment of the substrate support assembly;

To facilitate understanding, identical reference numerals have been used, wherever possible, to designate identical elements that are common to the figures. It is contemplated that elements and/or process steps of one embodiment may be beneficially incorporated in other embodiments without additional recitation.

DETAILED DESCRIPTION

Figure 1A:
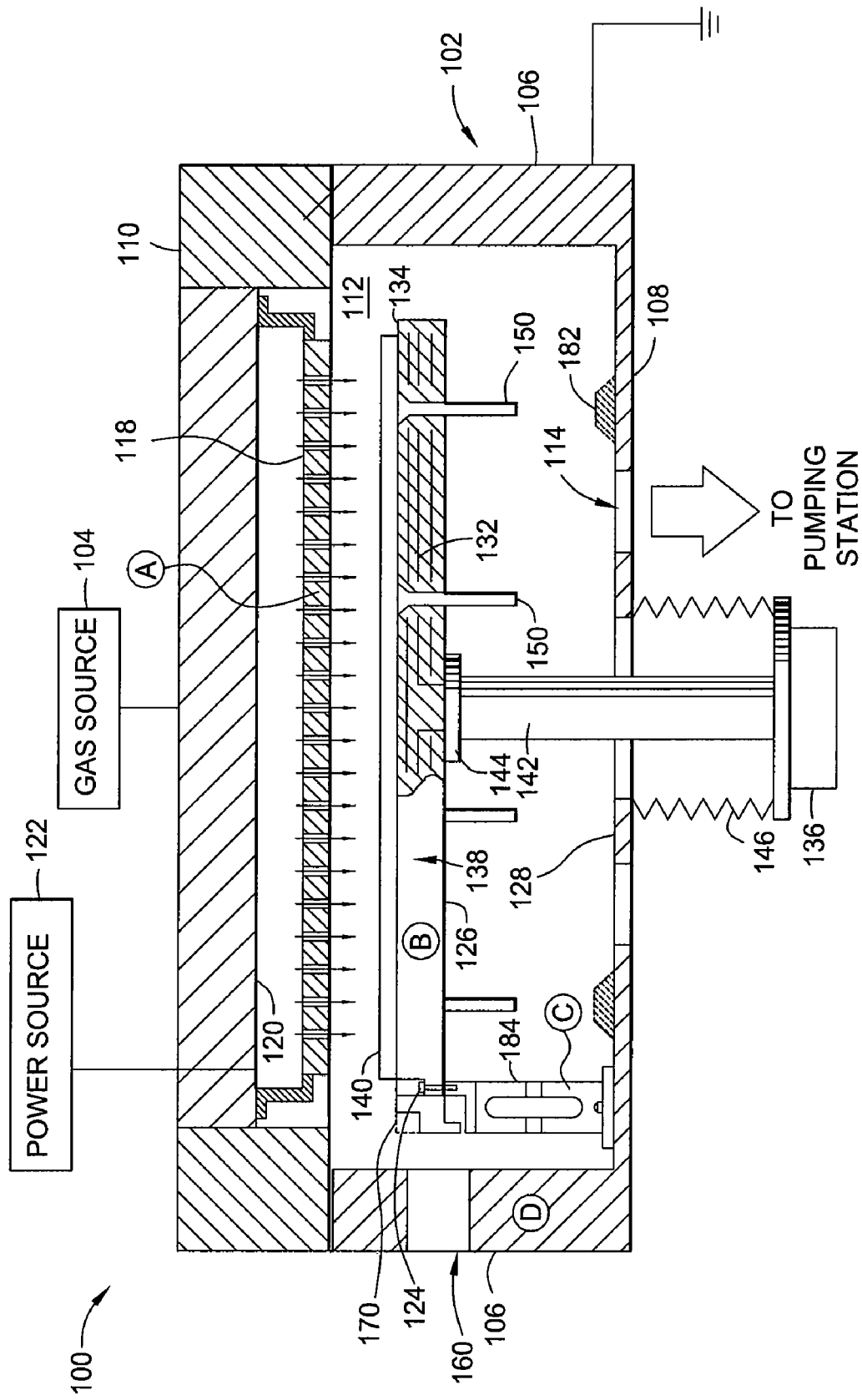
FIG. 1A is a cross-sectional view of one embodiment of a plasma enhanced chemical vapor deposition system having a wide RF ground strap and substrate extension bar of the present invention.

The present invention generally relates to a method and apparatus for plasma processing a substrate, and more particularly, a plasma processing chamber having a wide RF ground strap and/or a substrate extension bar and methods for using the same.

As used herein, the term substrate generally refers to any substrate or material surface formed on a substrate upon which film processing is performed.

The present invention is generally utilized with rectangular substrates. Other suitable substrates may be circular, such as wafers. The present invention may be utilized for any substrate size. However, the present invention provides particular advantage in sizes 15K (about 15,600 cm$^2$), 25K (about 27,750 cm$^2$), and above, more preferably 40K (about 41,140 cm$^2$) and above, for example 50K, 55K, and 60K, due to the increased grounding required for larger susceptors.

Liquid crystal displays or flat panels are commonly used for active matrix displays such as computer and television monitors. Generally, flat panels comprise two plates having a layer of liquid crystal material sandwiched therebetween. At least one of the plates includes at least one conductive film disposed thereon that is coupled to a power source. Power, supplied to the conductive film from the power supply, changes the orientation of the crystal material, creating a patterned display.

In order to manufacture these displays, a substrate, such as a glass or polymer workpiece, is typically subjected to a plurality of sequential processes to create devices, conductors and insulators on the substrate. Each of these processes is generally performed in a process chamber configured to perform one or more process steps. In order to efficiently complete the entire sequence of processing steps, a number of process chambers are typically coupled to a central transfer chamber that houses a robot to facilitate transfer of the substrate between the process chambers. A processing platform having this configuration is generally known as a cluster tool, examples of which are the families of AKT plasma enhanced chemical vapor deposing (PECVD) processing platforms available from AKT America, Inc., of Santa Clara, Calif.

Although the invention is illustratively described, shown and practiced within a large area substrate processing system, the invention may find utility in other plasma processing systems, including those from other manufacturers where it is desirable to ensure that one or more ground paths remain functioning at a level that facilitates acceptable processing within the system. Other exemplary processing systems on which the invention may be practiced include the CENTURA ULTIMA HDP-CVD™ system, the PRODUCER APF PECVD™ system, the PRODUCER BLACK DIAMOND™ system, the PRODUCER BLOK PECVD™ system, the PRODUCER DARC PECVD™ system, the PRODUCER HARP™ system, the PRODUCER PECVD™ system, the PRODUCER STRESS NITRIDE PECVD™ system, and the PRODUCER TEOS FSG PECVD™ system, all of which are available from Applied Materials, Inc. of Santa Clara, Calif.

Plasma enhanced chemical vapor deposition (PECVD) techniques generally promote excitation and/or disassociation of the reactant gases by the application of the electric field to a reaction zone near the substrate surface, creating a plasma of reactive species immediately above the substrate surface. The reactivity of the species in the plasma reduces the energy required for a chemical reaction to take place, in effect lowering the required temperature for such PECVD processes.

FIG. 1A is a side view of a system 100 that is suitable for chemical vapor deposition (CVD) or plasma enhanced chemical vapor deposition (PECVD) processes for fabricating the circuitry of a flat panel display on a large area glass, polymer, or other suitable substrate. The system 100 is configured to form structures and devices on a large area substrate for use in the fabrication of liquid crystal displays (LCD's), flat panel displays, organic light emitting diodes (OLED's), or photovoltaic cells for solar cell arrays. The structures may be a plurality of back channel etch inverted staggered (bottom gate) thin film transistors which may comprise a plurality of sequential deposition and masking steps. Other structures may include p-n junctions to form diodes for photovoltaic cells.

The system 100 is configured to deposit a variety of materials on a large area substrate that include but are not limited to dielectric materials (e.g., SiO$_2$, SiO$_x$N$_y$, derivatives thereof or combinations thereof, semiconductive materials (e.g., Si and dopants thereof, barrier materials (e.g., SiN$_x$, SiO$_x$N$_y$, or derivatives thereof). Specific examples of dielectric materials and semiconductive materials that are formed or deposited by the system 100 onto the large area substrates may include epitaxial silicon, polycrystalline silicon, amorphous silicon, microcrystalline silicon, silicon germanium, germanium, silicon dioxide, silicon oxynitride, silicon nitride, dopants thereof (e.g., B, P, or As), derivatives thereof or combinations thereof. The system 100 is also configured to receive gases such as argon, hydrogen, nitrogen, helium, or combinations thereof, for use as a purge gas or a carrier gas (e.g., Ar, H$_2$, N$_2$, He, derivatives thereof, or combinations thereof). One example of depositing silicon thin films on a large area substrate using the system 100 may be accomplished by using silane as the precursor gas in a hydrogen carrier gas.

Examples of various devices and methods of depositing thin films on a large area substrate using the system 100 may be found in U.S. patent application Ser. No. 11/021,416, filed Nov. 17, 2005, published as U.S. 2005-0255257, entitled "Method Of Controlling The Film Properties Of PECVD-Deposited Thin Films," and U.S. patent application Ser. No. 11/173,210, filed Jul. 1, 2005, published as U.S. 2006-0228496, entitled "Plasma Uniformity Control By Gas Diffuser Curvature," which are both incorporated by reference herein to the extent the applications are not inconsistent with this specification. Other examples of various devices that may be formed using the system 100 may be found in U.S. patent application Ser. No. 10/889,683, filed Jul. 12, 2004, published as U.S. 2005-0251990, entitled "Plasma Uniformity Control by Gas Diffuser Hole Design," and in U.S. Pat. No. 7,125,758, issued Oct. 24, 2006, entitled "Controlling the Properties and Uniformity of a Silicon Nitride Film by Controlling the Film Forming Precursors," both of which are incorporated by reference herein to the extent not inconsistent with this specification.

Figure 1B:
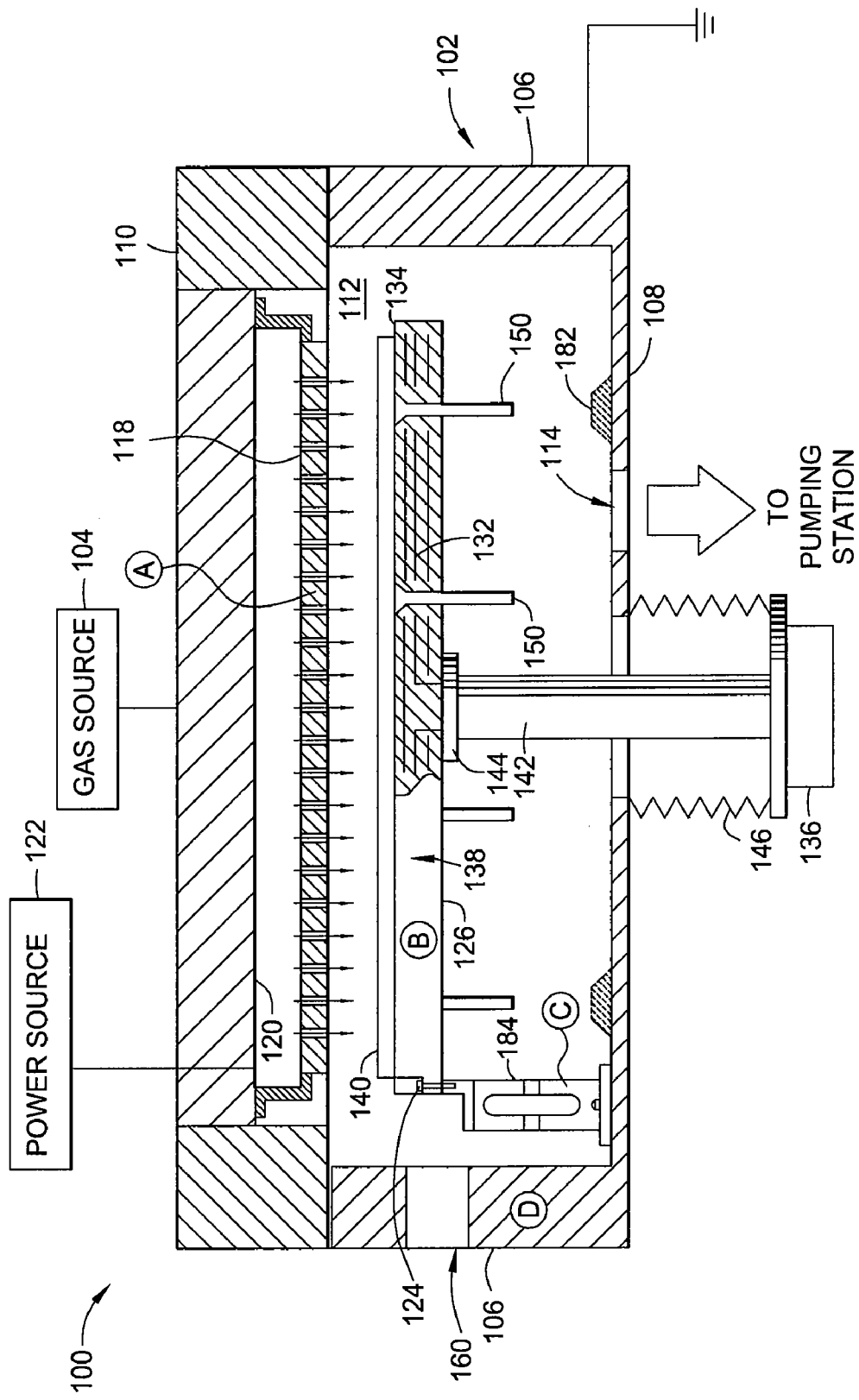
FIG. 1B is a cross-sectional view of one embodiment of a plasma enhanced chemical vapor deposition system having a wide RF ground strap of the present invention.
Figure 1C:
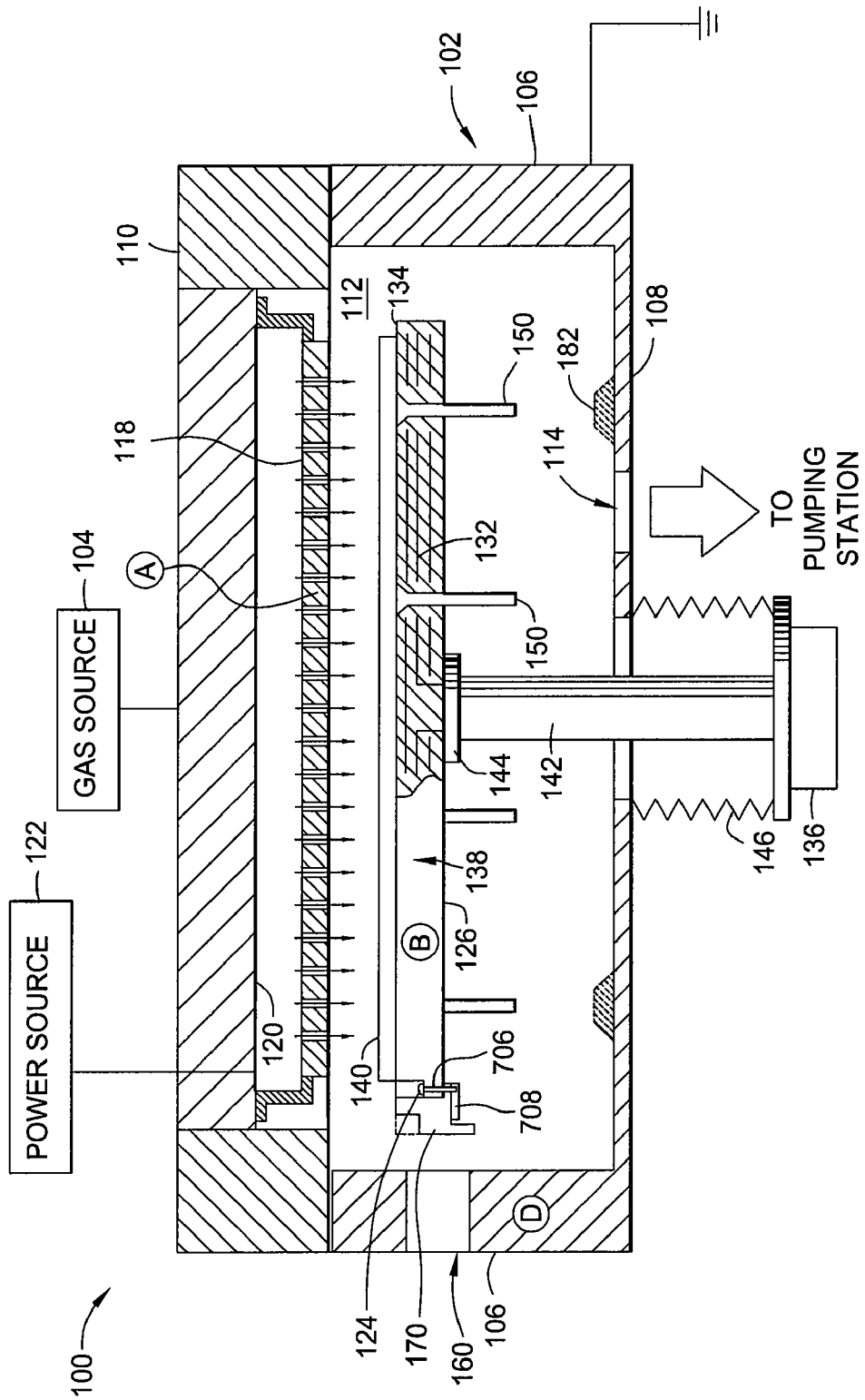
FIG. 1C is a cross-sectional view of one embodiment of a plasma enhanced chemical vapor deposition system having a substrate extension bar of the present invention.

FIG. 1A depicts one embodiment of a plasma enhanced chemical vapor deposition system 100 having one embodiment of an extension bar 170 and a wide RF ground strap 184 of the present invention. Both the extension bar 170 and the wide RF ground strap 184 facilitate the deposition of a dense film on a chamber body 102. The wide RF ground strap 184 also contributes to the effectiveness of a ground path coupled between a substrate support assembly 138 and a chamber body 102. It is contemplated that embodiments of the extension bar 170 and the wide RF ground strap 184 may be used either alone, as shown in FIG. 1B and FIG. 1C, or in combination, as shown in FIG. 1A. It is further contemplated that embodiments of the extension bar 170, embodiments of the wide RF ground strap 184, and methods for using the same described herein, along with derivations thereof, may be utilized in other processing systems, including those from other manufacturers.

In the embodiment depicted in FIG. 1A, the grounded chamber body 102 has a gas source 104, a power source 122 and a controller (not shown) coupled thereto. The controller is utilized to control the processes performed in the system 100. In one embodiment, the controller includes a central processing unit (CPU) (not shown), support circuits (not shown) and memory (not shown). The CPU may be one of any form of computer processor that can be used in an industrial setting for controlling various chambers and subprocessors. The memory is coupled to the CPU. The memory, or computer-readable medium, may be one or more of readily available memory such as random access memory (RAM), read only memory (ROM), floppy disk, hard disk, or any other form of digital storage, local or remote. The support circuits are coupled to the CPU for supporting the processor in a conventional manner. These circuits include cache, power supplies, clock circuits, input/output circuitry, subsystems, and the like.

The chamber body 102 has sidewalls 106, a bottom 108, and a lid assembly 110 that define a process volume 112. The process volume 112 is typically accessed through a slit valve 160 in the sidewall 106 that facilitates movement of a large area substrate 140 (hereinafter referred to as "substrate 140") into and out of the chamber body 102. The large area substrate 140 may be a glass or polymer workpiece, and in one embodiment has a plan surface area greater than about 2,500 cm$^2$. Although the present invention may be utilized for any substrate size, the wide RF ground strap 184 of the present invention finds particular advantage in sizes 15,000 cm$^2$ and above, more preferably 40,000 cm$^2$ and above due to the increased grounding required for larger susceptors. The sidewalls 106 and bottom 108 of the chamber body 102 are typically fabricated from a unitary block of aluminum or other material compatible with process chemistries. The bottom 108 of the chamber body 102 has a pumping port 114 formed therethrough that couples the process volume 112 to a pumping system (not shown) to facilitate control of pressure within the process volume 112 and exhaust gases and byproducts during processing.

The lid assembly 110 is supported by the sidewalls 106 and can be removed to service the interior of the chamber body 102. The lid assembly 110 is generally comprised of aluminum. A distribution plate 118 is coupled to an interior side 120 of the lid assembly 110. The distribution plate 118 is typically fabricated from aluminum. The center section of the distribution plate 118 includes a perforated area through which process and other gases supplied from the gas source 104 are delivered to the process volume 112. The perforated area of the distribution plate 118 is configured to provide a uniform distribution of gases passing through the distribution plate 118 into the chamber body 102. The power source 122 is coupled to the distribution plate 118 to provide an electrical bias that energizes the process gas and sustains a plasma formed from process gas in the interior process volume 112 below the gas distribution plate 118 during processing.

The heated substrate support assembly 138 is centrally disposed within the chamber body 102 and supports the substrate 140 during processing. The substrate support assembly 138 generally includes an electrically conductive support body 124 supported by a shaft 142 that extends through the chamber bottom 108. The support body 124 is generally polygonal in shape and covered with an electrically insulative coating (not shown) over at least the portion of the body 124 that supports the substrate 140. The coating may also cover other portions of the body 124. The substrate support assembly 138 is normally coupled to ground at least during processing.

The support body 124 may be fabricated from metals or other comparably electrically conductive materials, for example, aluminum. The insulative coating may be a dielectric material such as an oxide, silicon nitride, silicon dioxide, aluminum dioxide, tantalum pentoxide, silicon carbide or polyimide, among others, which may be applied by various deposition or coating processes, including, but not limited to, flame spraying, plasma spraying, high energy coating, chemical vapor deposition, spraying, adhesive film, sputtering and encapsulating.

In one embodiment, the support body 124 encapsulates at least one embedded heating element 132 and a thermocouple (not shown). The body 124 may include one or more stiffening members (not shown) comprised of metal, ceramic or other stiffening materials embedded therein.

The heating element 132, such as an electrode or resistive element, is coupled to a power source (not shown) and controllably heats the support assembly 138 and substrate 140 positioned thereon to a predetermined temperature. Typically, the heating element 132 maintains the substrate 140 at a uniform temperature of about 150 to at least about 460 degrees Celsius during processing. The heating element 132 is electrically floating relative to the body 124.

Generally, the support assembly 138 has a lower side 126 and an upper side 134 that supports the substrate 140 thereon. The lower side 126 has a stem cover 144 coupled thereto. The stem cover 144 generally is an aluminum ring coupled to the support assembly 138 that provides a mounting surface for the attachment of the shaft 142 thereto.

Generally, the shaft 142 extends from the stem cover 144 through the chamber bottom 108 and couples the support assembly 138 to a lift system 136 that moves the support assembly 138 between an elevated process position (as shown) and a lowered position that facilitates substrate transfer. A bellows 146 provides a vacuum seal between the process volume 112 and the atmosphere outside the chamber body 102 while facilitating the vertical movement of the support assembly 138. The shaft 142 additionally provides a conduit for electrical and thermocouple leads between the support assembly 138 and other components of the system 100.

The shaft 142 may be electrically isolated from the chamber body 102. In the embodiment depicted in FIG. 1A, a dielectric isolator 128 is disposed between the shaft 142 and chamber body 102. The isolator 128 may additionally support or be configured to function as a bearing for the shaft 142.

In one embodiment, the support assembly 138 additionally supports a circumscribing shadow frame (not shown). Generally, the shadow frame prevents deposition at the edge of the substrate 140 and support assembly 138 so that the substrate 140 does not stick to the support assembly 138.

The support assembly 138 has a plurality of holes disposed therethrough that accept a plurality of lift pins 150. The lift pins 150 are typically comprised of ceramic or anodized aluminum and have first ends that are substantially flush with or slightly recessed from the upper side 134 of the support assembly 138 when the lift pins 150 are in a normal position (i.e., retracted relative to the support assembly 138). As the support assembly 138 is lowered to a transfer position, the lift pins 150 come in contact with the bottom 108 of the chamber body 102 and are displaced through the support assembly 138 to project from the upper side 134 of the support assembly 138, thereby placing the substrate 140 in a spaced-apart relation to the support assembly 138.

In one embodiment, lift pins 150 of varying lengths (as shown in FIG. 1A) are utilized so that they come into contact with the bottom 108 and are actuated at different times. For example, the lift pins 150 that are spaced around the outer edges of the substrate 140, combined with relatively shorter lift pins 150 spaced inwardly from the outer edges toward the center of the substrate 140, allow the substrate 140 to be first lifted from its outer edges relative to its center. In another embodiment, lift pins 150 of a uniform length may be utilized in cooperation with bumps or plateaus 182 (shown in phantom) positioned beneath the outer lift pins 150, so that the outer lift pins 150 are actuated before and displace the substrate 140 a greater distance from the upper surface 134 than the inner lift pins 150. Alternatively, the chamber bottom 108 may comprise grooves or trenches positioned beneath the inner lift pins 150, so that the inner lift pins 150 are actuated after and displaced a shorter distance than the outer lift pins 150. Embodiments of a system having lift pins configured to lift a substrate in an edge to center manner from a substrate support that may be adapted to benefit from the invention are described in U.S. patent application Ser. No. 10/308,385, filed Dec. 2, 2002 by Shang, et al., now issued as U.S. Pat. No. 6,676,761 on Jan. 31, 2004, and described in U.S. patent application Ser. No. 10/460,916, filed Jun. 12, 2003 by Blonigan, et al., now issued as U.S. Pat. No. 7,083,702 on Oct. 3, 2006, both of which are hereby incorporated by reference in there entireties.

The support assembly 138 is generally grounded during processing such that an RF power supplied by the power source 122 to the distribution plate 118 (or other electrode positioned within or near the lid assembly 110 of the chamber body 102) may excite the gases disposed within the process volume 112 between the support assembly 138 and the distribution plate 118. The RF power from the power source 122 is generally selected commensurate with the size of the substrate 140 to drive the chemical vapor deposition process.

FIG. 1B is a cross-sectional view of one embodiment of a plasma enhanced chemical vapor deposition system 100 having a wide RF ground strap 184 of the present invention.

FIG. 1C is a cross-sectional view of one embodiment of a plasma enhanced chemical vapor deposition system 100 having a substrate extension bar 170 of the present invention. In one embodiment, the extension bar 170 is attached to the peripheral edge of the conductive support body via a threaded hole, fastener 706, and clamp 708.

FIG. 2 is a top view of one embodiment of the substrate support assembly 138 showing one embodiment of the extension bar 170 attached to the substrate support assembly 138. In one embodiment, the extension bar 170 has at least one notch 202. The notch 202 allows the stop bar 702 (shown in FIG. 7) to contact the extension bar 170 and prevent the substrate support assembly 138 from any further upward vertical movement. Although the embodiment depicted in FIG. 2 shows one extension bar 170 coupled with the peripheral edge of the substrate support assembly 138, it should be understood that any number of extension bars, for example, four extension bars, may be used with the present invention. For embodiments using multiple extension bars it is further contemplated that the extension bars may form one unitary piece which may be coupled with the substrate support assembly 138. One embodiment of the embedded heating element 132 is also depicted.

As the size of substrate supports increases, installation of a substrate support assembly with an increased surface area into a process chamber becomes very difficult and in some cases impossible. Due to these size restrictions, when installing the support assembly 138 into the process system 100, the support assembly 138 is installed into the process system 100 prior to the installation of the extension bars 170. Thus the extension bars 170 allows for an increase in the surface area of the support assembly 138 after installation of the support assembly 138 into the process system 100.

Figure 3:
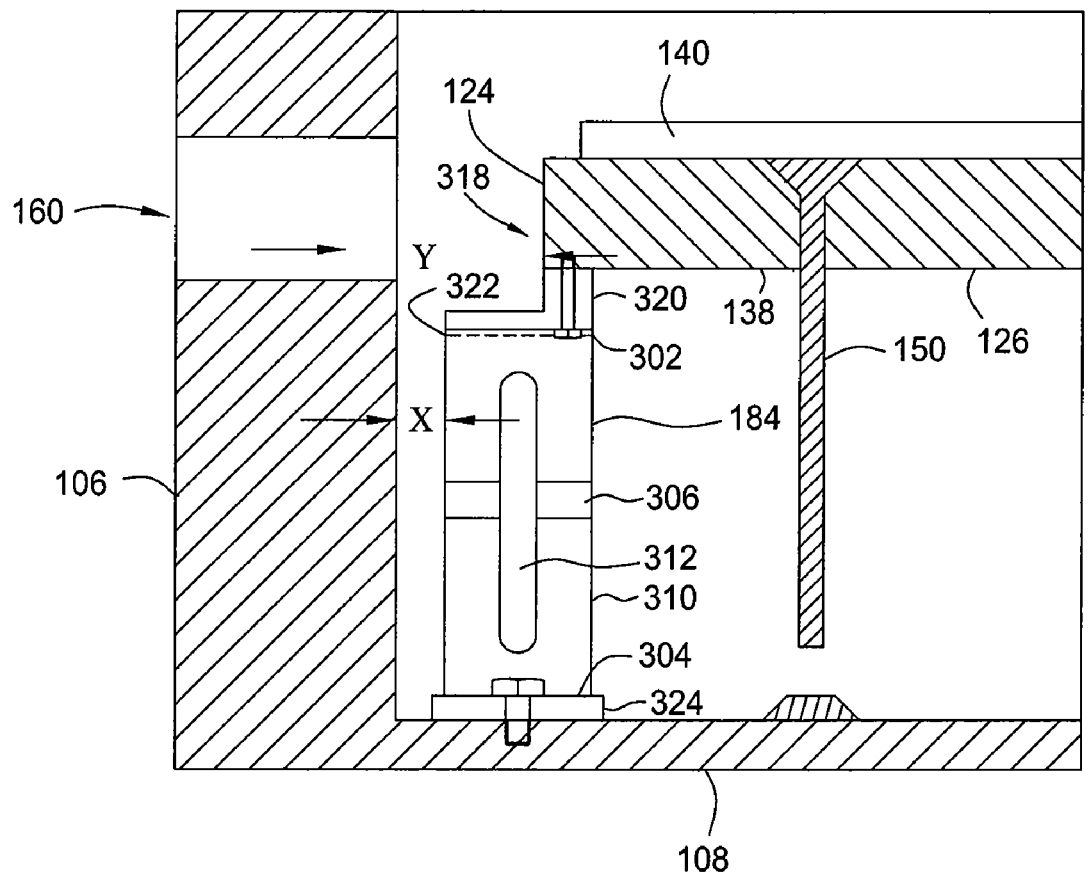
FIG. 3 is a cross-sectional view of one embodiment of a plasma enhanced chemical vapor deposition system having a wide RF ground strap according to the present invention.
Figure 4:
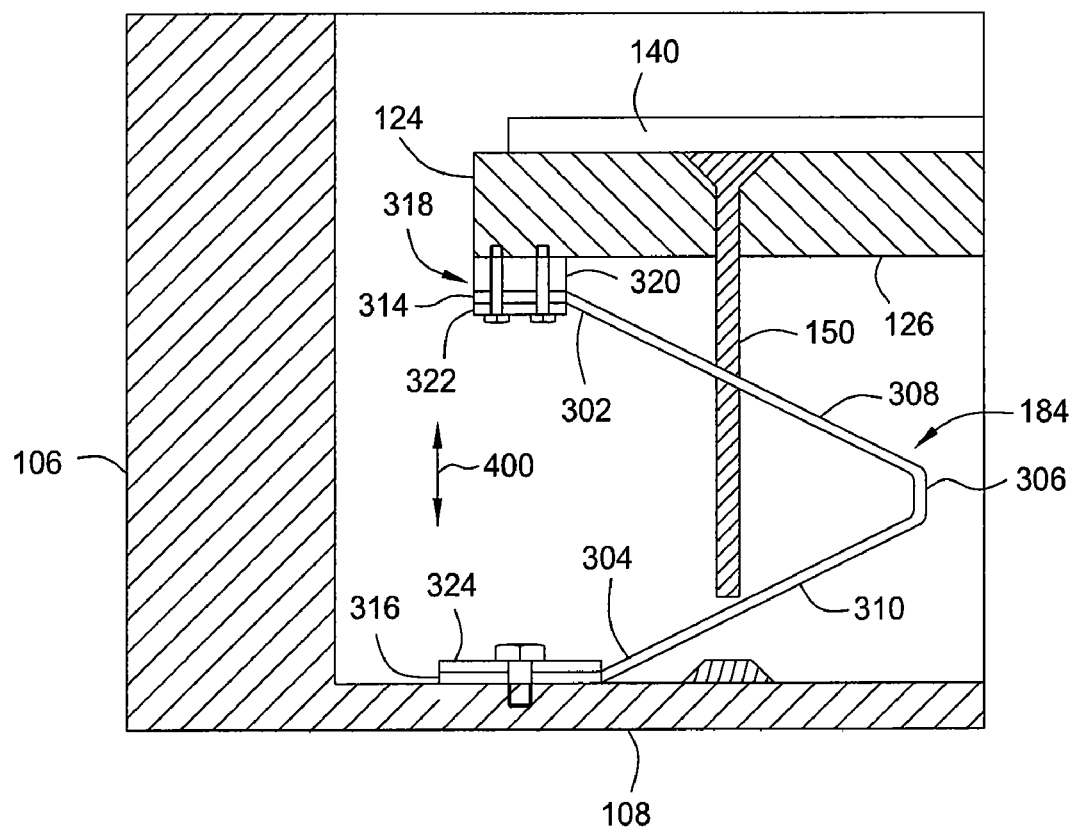
FIG. 4 is a side cross-sectional view of the wide RF ground strap depicted in FIG. 3.
Figure 5:
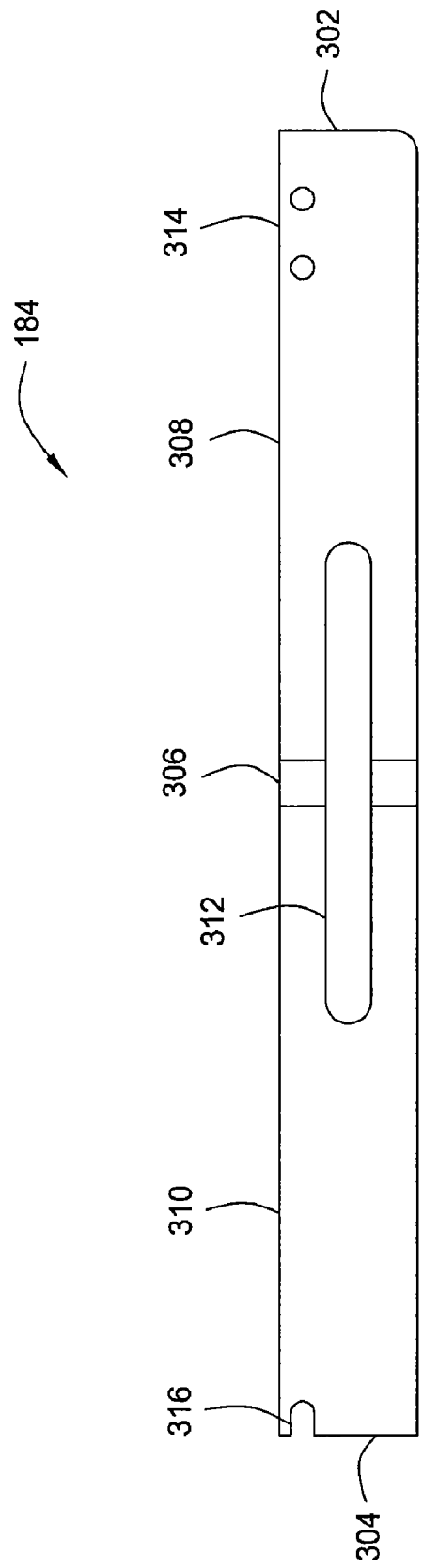
FIG. 5 is a plan view of one embodiment of a wide RF ground strap according to the present invention.

Referring to FIGS. 3, 4, and 5, the wide RF ground strap 184 generally comprises a first end 302 and a second end 304, and at least one bend 306. A first flexure 308 extends from the bend 306 toward the first end 302 and a second flexure 310 extends from the bend 306 toward the second end 304. The first end 302 comprises a mounting flange 314 and the second end 304 also comprises a mounting flange 316. The flexures 308, 310 are substantially quadrilateral in shape and allow for vertical movement of the substrate support assembly 138 relative to the chamber bottom 108. In one embodiment, the wide RF ground strap 184 has a slot 312 extending from the first flexure 308 through the bend 306 to the second flexure 310. The slot 312 helps increase the flexibility of the wide RF ground strap 184.

The wide RF ground strap 184 comprises a flexible, low impedance conductive material that is resistant to processing and cleaning chemistries. In one embodiment, the wide RF ground strap 184 is comprised of aluminum. Alternatively, the wide RF ground strap 184 may comprise titanium, stainless steel, beryllium copper or a flexible material that is coated with a conductive metallic coating.

FIG. 3 is a cross-sectional view of one embodiment of a plasma enhanced chemical vapor deposition system having a wide RF ground strap according to the present invention. The wide RF ground strap 184 provides an RF current return path between the support assembly 138 and the chamber body 102. The first end 302 of the wide RF ground strap 184 is electrically coupled to the support assembly 138 via a connection assembly 318, typically to the lower side 126 of the support body 124, while the second end 304 is electrically coupled to the chamber bottom 108 by a bottom clamp 324. The wide RF ground strap 184, may be coupled to the support body 124 via other means such as, for example, fasteners, clamps or other methods that maintain electrical connection between the support body 124 and the wide RF ground strap 184. The connection assembly 318 extends outward from and perpendicular to the perimeter of the support body 124. The connection assembly 318 comprises a top piece 320 and a bottom piece 322. The top piece 320 comprises an L-shaped piece and the bottom piece 322 comprises a flat plate. The mounting flange 314 of the first end 302 of the wide ground strap 184 is disposed between the top piece 320 and the bottom piece 322. In the embodiment depicted in FIG. 3, the connection assembly 318 is secured to the support body 124 via two fasteners and corresponding threaded holes. The second end 304 has a mounting flange 316 coupled thereto that facilitates coupling the wide RF ground strap 184 to the chamber bottom 108. In one embodiment, the mounting flange 316 is secured to the chamber bottom 108 between the chamber bottom 108 and a bottom clamp 324 via a fastener and threaded hole. It is contemplated that adhesives, clamps or other methods that maintain electrical connection between the chamber body 102 and the wide RF ground strap 184 may be utilized to attach the wide RF ground strap 184 to the chamber bottom 108 and/or the support assembly 138.

The connection assembly 318 and the bottom clamp 324 each comprise low impedance conductive materials that are resistant to processing and cleaning chemistries. In one embodiment, the connection assembly 318 and the bottom clamp 324 comprise aluminum. Alternatively, the materials may comprise titanium, stainless steel, beryllium copper or any material that is coated with a conductive metallic coating. In another embodiment, the connection assembly 318 comprises a first conductive material and the bottom clamp 324 comprises a second conductive material, wherein the first conductive material and the second conductive material are different materials.

In one embodiment, at least a portion of the wide RF ground strap 184 is positioned at a distance X from the sidewall 106. The support body 124 is positioned at a distance Y from the sidewall 106. The distance X between at least a portion of the wide RF ground strap 184 and the sidewall 106 is generally less than the distance Y between the support body 124 and the sidewall 106. In one embodiment, for a substrate of 25K (about 27,750 cm$^2$) or greater, the distance X is generally between about 0.2 cm and about 3 cm, for example about 0.5 cm.

The wide RF ground strap 184 significantly shortens the return path for RF current to ground as compared to conventional grounding techniques. Current passes from the plasma to the substrate 140, which is in electrical contact with the support body 124 of the support assembly 138. The lower side 126 of the body 124 is in electrical contact with the wide RF ground strap 184, so that the current passes from the body 124 through the wide RF ground strap 184 and to the chamber bottom 108 which is coupled to ground. Furthermore, the wide RF ground strap 184 provides a larger current carrying area than existing conductive strap designs, making them ideally suitable for use in large area processing applications. The shorter distance and larger current carrying capacity of the wide RF ground strap 184 results in much lower voltage differential between the surface of the support assembly 138 and the grounded chamber body 102, thereby substantially reducing the likelihood of plasma ignition below the substrate support assembly 138 that may sputter unwanted contaminants in the system 102.

In one embodiment, the substrate support assembly 138 is grounded by a plurality of wide RF ground straps 184 that provide a low-impedance RF return path between the support body 124 and ground. For example, four groups of ground path members 184 may be coupled to each respective side of the four-sided substrate support body 124. Each group may contain between 1 wide RF ground straps 184 and 15 wide RF ground straps 184, for example between 11 and 13 wide RF ground straps 184. In another embodiment, any number of wide RF ground straps 184 may be used in conjunction with conventional ground straps.

In one embodiment, at least one ground path integrity sensor (not shown) as described in U.S. patent application Ser. No. 11/564,463 filed Nov. 20, 2006 by White, et al., is interfaced with the wide RF ground strap 184. The ground path integrity sensor facilitates monitoring whether the wide RF ground strap 184 remains suitable for conducting current between the support body 124 and the chamber body 102.

FIG. 4 is a side view of the wide RF ground strap depicted in FIG. 3. As shown, the wide RF ground strap 184 has sufficient flexibility to allow the substrate support assembly 138 to change elevations in the directions shown by arrow 400. Although the wide RF ground strap 184 shown in FIG. 4 comprises only one bend 306, multiple bends may be formed in the wide RF ground strap 184 to form an accordion like structure. Other embodiments also contemplate a wide RF ground strap without any bends. The bend 306 is positioned below the polygonal substrate support assembly 138 and is oriented substantially parallel to the perimeter of the support assembly 138. The bend 306 is pre-formed in the wide RF ground strap 184 to increase the useful life of the wide RF ground strap 184; repeated stress transmitted into the wide RF ground strap 184 by vertical movement of the substrate assembly 138 in the direction indicated by arrow 400 might otherwise cause the bends to crack, necessitating replacement of the wide RF ground strap 184. With reference to FIG. 1, as the shaft 142 moves downward, the plurality of lift pins 150 contact the chamber bottom 108 thus raising the substrate 140 off of the support assembly 138. During the downward movement of the shaft 142, the bend 306 of the wide RF ground strap 184 projects inward from the perimeter of the substrate support assembly 138, while still maintaining electrical contact with the perimeter of the support assembly 138. As shown if FIG. 4, as the wide RF ground strap 184 flexes, the wide RF ground strap 184 does not intersect the lift pin 150.

FIG. 5 is a plan view of one embodiment of a wide RF ground strap according to the present invention. As discussed above, the wide RF ground strap 184 has a first end 302 and a second end 304, and at least one bend 306. In one embodiment, the length of the ground strap from first end 302 to second end 304 is between about 60 cm and about 70 cm, for example about 62 cm. In one embodiment, the first flexure 308 extending from the bend 306 toward the first end 302 is between about 30 cm and about 35 cm, for example about 31 cm in length. In one embodiment, the second flexure 310 extending from the bend 306 toward the second end 304 is between about 30 cm and about 35 cm, for example about 31 cm in length. The flexures are substantially quadrilateral in shape and allow for vertical movement of the support assembly relative to the chamber bottom 108. In one embodiment, the wide RF ground strap 184 has a slot extending from the first flexure 308 through the bend 306 to the second flexure 310. The slot begins between about 10 cm and about 20 cm, for example about 19 cm from the first end 302 and extends through the bend 306 and ends between about 10 cm and about 20 cm, for example about 19 cm from the second end 304. The slot is between about 1 cm and about 8 cm wide, for example about 1.6 cm wide. The wide RF ground strap is between about 0.2 mm and about 0.3 mm thick, for example, about 0.25 mm thick. The mounting flange 314 of the first end 302 of the wide RF ground strap 184 comprises two fastener holes adapted to receive two fasteners disposed through the connection assembly 318 as shown in FIG. 3 and FIG. 4. The mounting flange 316 of the second end 304 of the wide RF ground strap 184 comprises one fastener hole adapted to receive one fastener disposed through the bottom clamp 324.

Figure 6C:
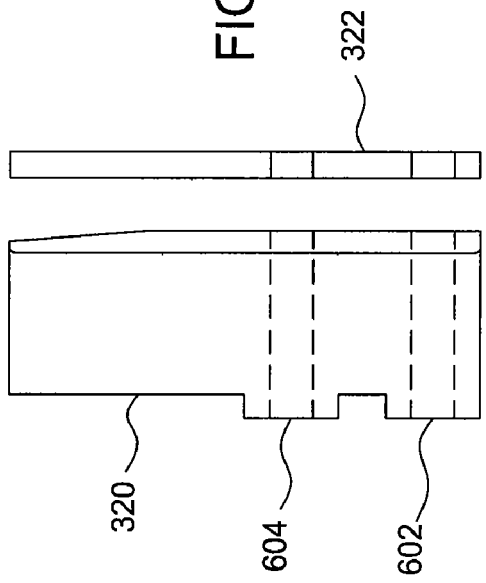
FIG. 6C is a front view of the connection assembly of FIG. 6A according to the present invention.
Figure 6B:
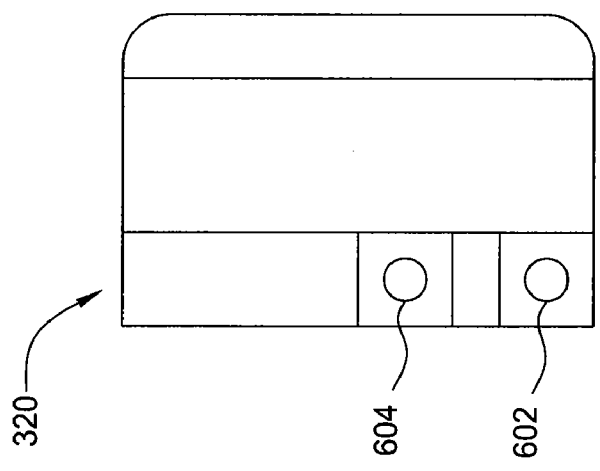
FIG. 6B is a top view of the connection assembly of FIG. 6A according to the present invention.
Figure 6A:
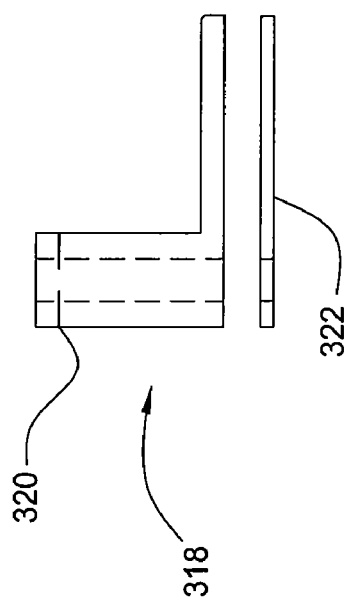
FIG. 6A is a side view of one embodiment of a connection assembly according to the present invention.

FIG. 6A is a side view of one embodiment of a connection assembly 318 according to the present invention. The connection assembly 318 comprises a top piece 320 and a bottom piece 322. The top piece 320 comprises an L-shaped piece and the bottom piece 322 comprises a flat plate. Both the top piece 320 and the bottom piece 322 have at least one set of fastener holes aligned and adapted to receive at least one fastener (not shown), such as a mounting screw, which is disposed through bottom piece 322, mounting flange 314 of the wide RF ground strap 184, the top piece 320, and finally through the support body 124. Thus, the wide RF ground strap 184 is sandwiched between the bottom piece 322 and the top piece 320. The connection assembly 318 extends outward from and perpendicular to the perimeter of the support body 124. FIG. 6B is a top view of the top piece 320 of the connection assembly 318 of FIG. 6A according to the present invention. The top piece has at least one set of fastener holes 602, 604 aligned and adapted to receive at least one fastener. FIG. 6C is a front view of the connection assembly of FIG. 6A according to the present invention.

Figure 7:
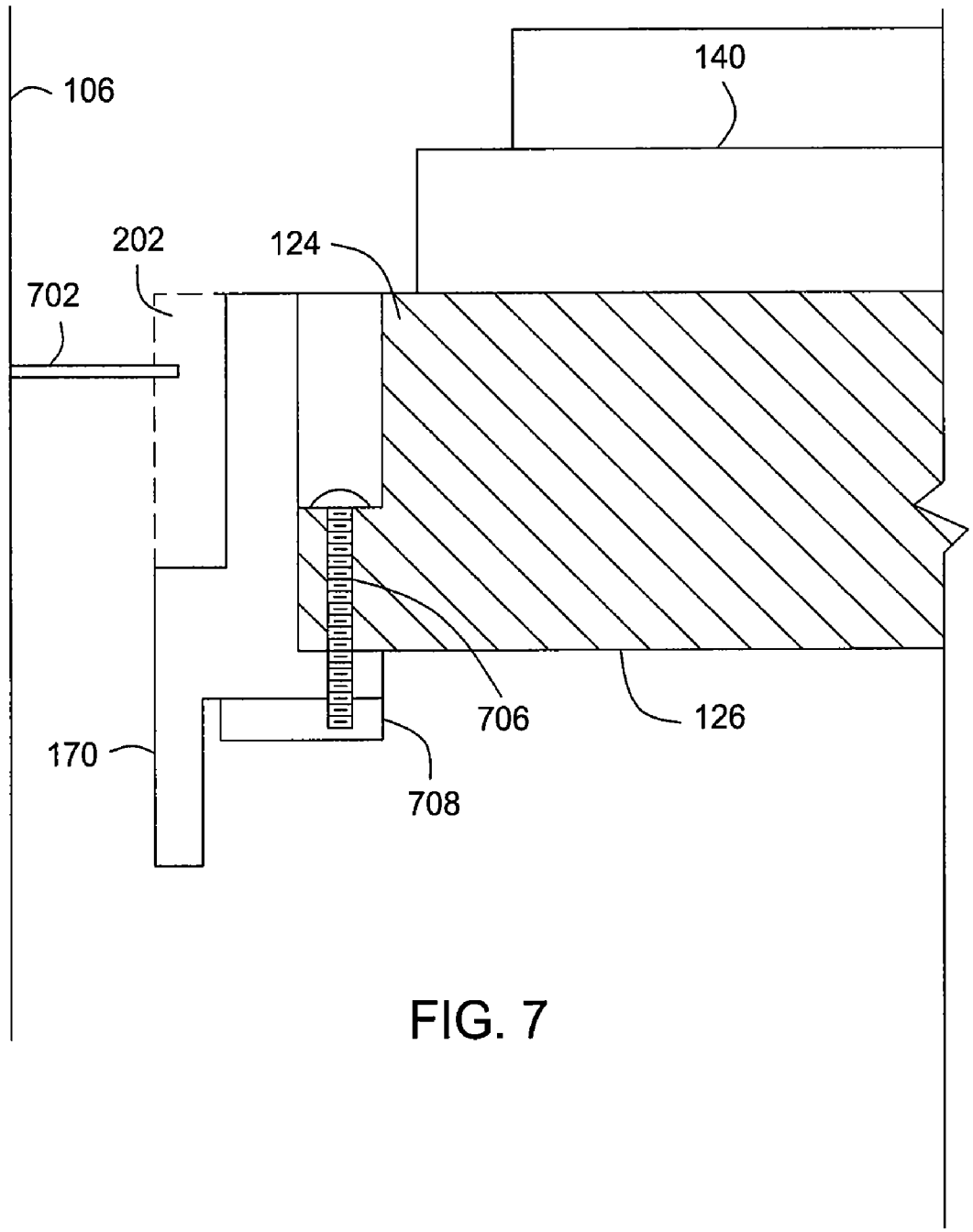
FIG. 7 is a cross-sectional view of one embodiment of a plasma enhanced chemical vapor deposition system having a substrate extension bar according to the present invention.

FIG. 7 is a cross-sectional view of one embodiment of a plasma enhanced chemical vapor deposition system having a substrate extension bar according to the present invention. In this embodiment, although the substrate extension bar 170 is depicted without the wide RF ground strap 184, the substrate extension bar 170 may be used in conjunction with the wide RF ground strap 184 as shown in FIG. 1. The extension bar 170 is attached to the peripheral edge of the support body 124 of the substrate support assembly 138. In one embodiment, the extension bar 170 is attached to the peripheral edge of the support body 124 via a threaded hole, fastener 706, and clamp 708. It is contemplated that adhesives, brazing, or other methods may be utilized to attach the substrate extension bar 170 to the support assembly 138.

In one embodiment, the extension bar 170 has at least one notch 202. The notch 202 allows the stop bar 702, attached to the chamber sidewall 106, to contact the extension bar 170 and prevent the substrate support assembly 138 from any further upward vertical movement. The stop bar 702 is adjustable and may be positioned at different heights depending upon the needs of the user. The substrate extension bar 170 extends downward from and perpendicular to the lower side 126 of the support assembly 138. In other embodiments, the substrate extension bar 170 may be modified to form either acute or obtuse angles relative to the lower side 126 of the support assembly 138. The desired angle may be chosen based on the user's desire to control plasma formation on the sidewall 106 as well as below the support body 124 of the substrate support assembly 138.

The extension bar 170 may comprise low impedance conductive materials that are resistant to processing and cleaning chemistries. In one embodiment, the extension bar 170 comprises aluminum. Alternatively, the materials may comprise titanium, stainless steel (e.g. INCONEL®), beryllium copper or any material that is coated with a conductive metallic coating. In another embodiment, the extension bar 170 comprises a polymeric material. Polymeric materials include, for example, materials such as polyphenylene sulfide (PPS) and polyetheretherketone (PEEK).

Figure 8:
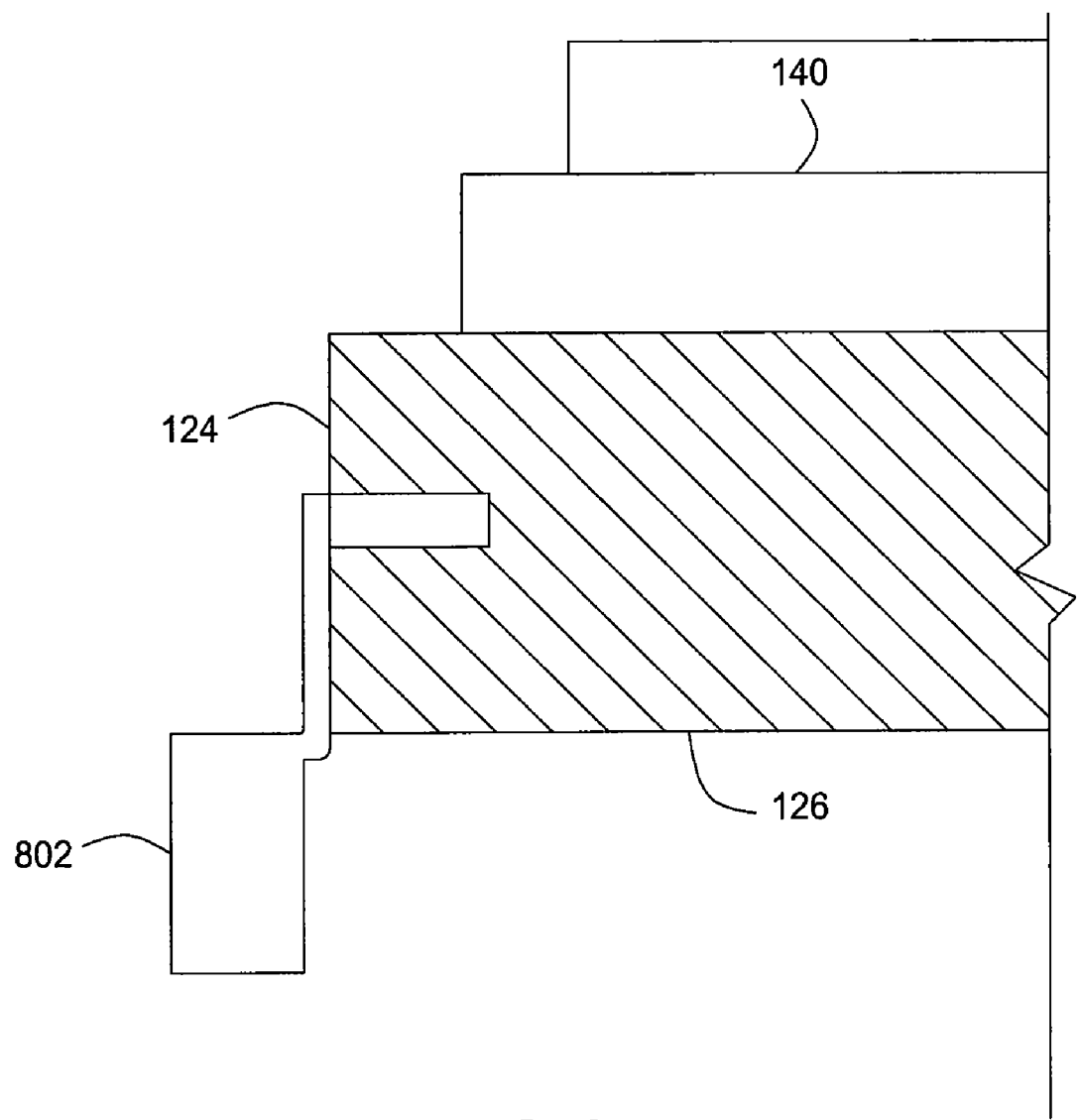
FIG. 8 a cross-sectional view of one embodiment of a plasma enhanced chemical vapor deposition system having a substrate extension bar according to the present invention.

FIG. 8 a cross-sectional view of one embodiment of a plasma enhanced chemical vapor deposition system having a substrate extension bar according to the present invention. In this embodiment, although the substrate extension bar 802 is depicted without the wide RF ground strap 184, the substrate extension bar 802 may be used in conjunction with the wide RF ground strap 184. In this embodiment, the substrate extension bar 802 is attached to the side of the support body 124. In one embodiment, the extension bar 170 is secured to the peripheral edge of the support body 124 via a threaded hole (not shown) and fastener (not shown). It is contemplated that adhesives, clamps, brazing, or other methods may be utilized to attach the substrate extension bar 802 to the support assembly 138.

Figure 9:
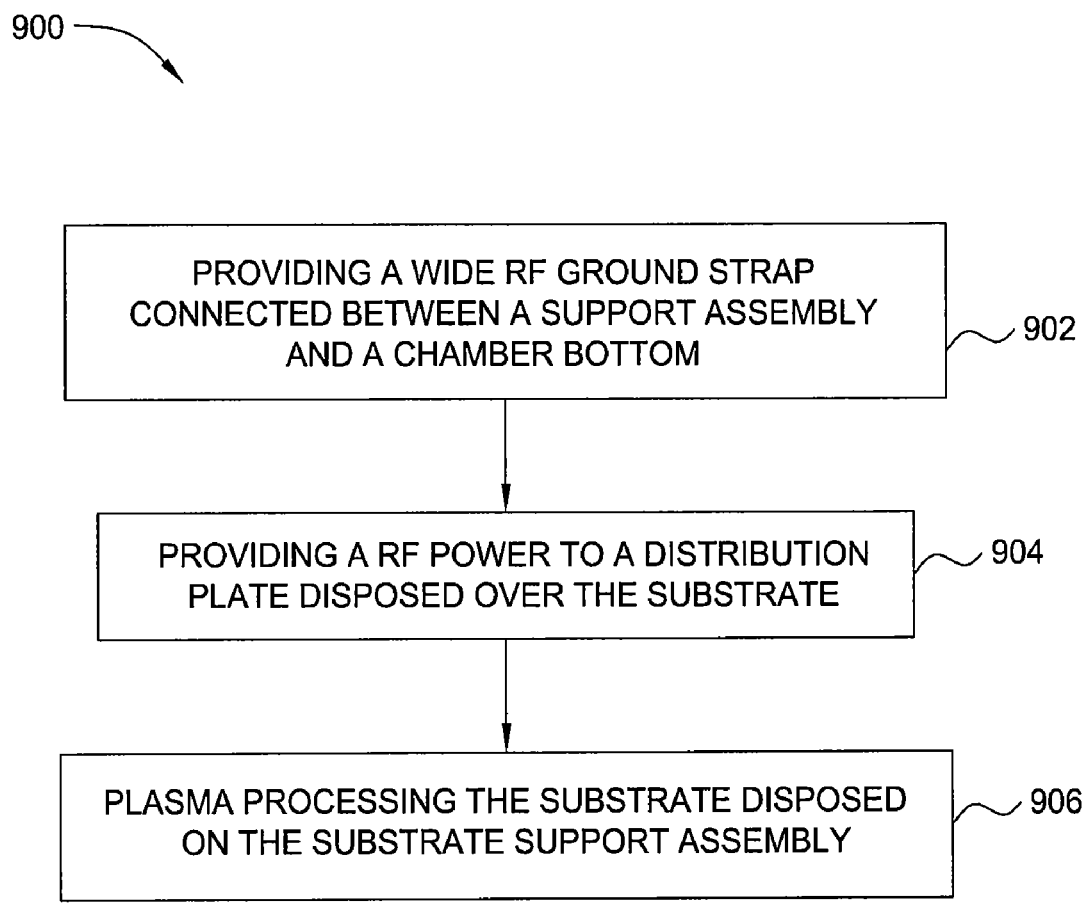
FIG. 9 shows a flow chart depicting the steps for processing a substrate according to one embodiment of the present invention.

FIG. 9 shows a flow chart 900 depicting the steps for processing a substrate according to one embodiment of the present invention. Referring to FIGS. 1-8, at step 902, a wide RF ground strap 184 coupled between a substrate support assembly 138 and a chamber bottom 108 is provided. Next, at step 904, a RF power is provided to a distribution plate 118 disposed over a substrate 140. Next, at step 906, the substrate 140 disposed on the substrate support assembly 138 is plasma processed.

Figure 10:
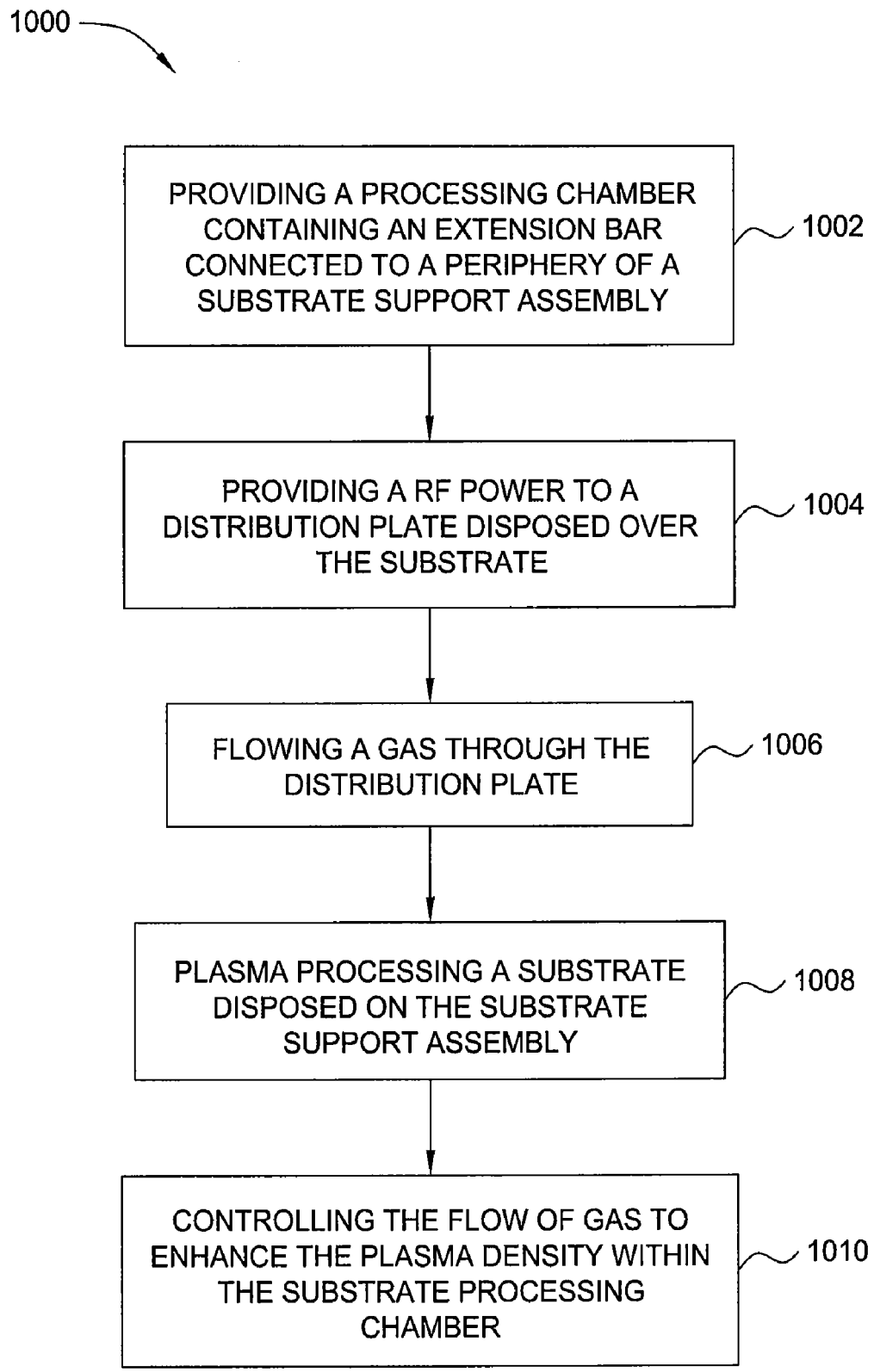
FIG. 10 shows a flow chart depicting the steps for processing a substrate according to one embodiment of the present invention.

FIG. 10 shows a flow chart 1000 depicting the steps for processing a substrate according to one embodiment of the present invention. Referring to FIGS. 1-8, at step 1002, a processing system 100 containing an extension bar 170 coupled to a periphery of a substrate support assembly 138 is provided. At step 1004, a RF power is provided to a distribution plate 118 disposed over the substrate 140. At step 1006, a gas is flowed through the distribution plate 118. At step 1008, a substrate 140 disposed on the substrate support assembly 138 is plasma processed. At step 1010, the flow of gas is controlled to enhance the plasma density within the substrate processing chamber.

Not wanting to be bound by theory unless explicitly stated in the claims, with reference to FIG. 1, the letter A represents the potential on the diffuser 118, the letter B represents the potential on the support assembly 138, the letter C represents the potential on the wide RF ground strap 184, and the letter D represents the potential on the chamber body 102. While in one aspect when applying a potential to the diffuser 118, such as potential A, the potential on the support assembly 138 although coupled to ground using wide RF ground strap 184 will not be zero but will be some potential such as potential B. This difference between potential A and potential B creates a plasma between the diffuser 118 and the support assembly 138. Similarly, the difference between the potential on the support assembly, potential B, and the potential on the chamber body, potential D, will create a plasma between the chamber body 102 and the support assembly 138. This potential differences lead to the unwanted deposition of a porous film on the chamber body 102. This porous film flakes off during deposition causing in-film particle contamination.

The wide RF ground strap 184 provides a low impedance path between the support assembly 138 and the chamber body 102. The increased width of the wide RF ground strap 184 reduces the potential of the support assembly 138, potential B so that it is closer to the potential of the chamber body 102, potential D, thus reducing the plasma produced between the chamber body 102 and the support assembly 138. The increased width of the wide RF ground strap also reduces breakage thus increasing the lifetime of the wide RF ground strap. Furthermore, the proximity of the wide RF ground strap 184 to the chamber sidewall 106 helps reduce the amount of inductive plasma created between the chamber sidewall 106, the support assembly 138, and the RF ground strap.

The extension bar 170 reduces the gas flow on both the chamber sidewall 106 and the slit valve tunnel 160. This reduced gas flow reduces the porous film deposited on both the chamber sidewall 106 and the slit valve tunnel 160.

Thus a method and apparatus has been provided for reducing in-film particle contamination in PECVD chambers. Advantageously, the use of the wide RF ground strap and its proximity to the chamber wall reduces the generation of plasma in undesirable parts of the chamber thus yielding a reduction of in-film particle contamination. The use of the wide RF ground strap further provides increased grounding capacity of the substrate supports while also increasing the lifetime of the ground straps and as a result reducing system downtime for chamber cleaning and replacement of the ground straps. Further advantage is provided by the use of the substrate extension bar 170 which allows for further control of gas flow and plasma production.

While the foregoing is directed to embodiments of the present invention, other and further embodiments of the invention may be devised without departing from the basic scope thereof, and the scope thereof is determined by the claims that follow.

The invention claimed is:

1. A substrate processing chamber, comprising:
   a chamber body comprising:
      a chamber bottom; and
      a sidewall having a slit valve;

a substrate support comprising a support body, wherein the substrate support is disposed in the chamber body;
at least one wide RF ground strap comprising:
   a first end coupled with the support body;
   a second end coupled with the chamber bottom;
   at least one bend located between the first end and the second end;
   a first flexure extending from the at least one bend toward the first end; and
   a second flexure extending from the at least one bend toward a second end, wherein the wide RF ground strap has a slot extending from the first flexure through the bend into the second flexure; and
at least one extension bar positioned along a peripheral edge of the support body.

2. The substrate processing chamber of claim 1, wherein a distance between at least a portion of the ground strap and the sidewall is less than a distance between the support body and the sidewall.

3. The substrate processing chamber of claim 2, wherein the distance between the sidewall and the support body is between about 0.2 cm and about 3 cm.

4. The substrate processing chamber of claim 1, wherein the at least one extension bar is positioned adjacent to the sidewall.

5. The substrate processing chamber of claim 1, wherein the at least one extension bar extends downward from and perpendicular to a lower side of the support body.

6. The substrate processing chamber of claim 1, wherein the substrate support is coupled to a lift mechanism adapted to allow vertical motion of the substrate support.

7. The substrate processing chamber of claim 1, wherein the chamber bottom has a pumping port coupling a process volume of the substrate processing chamber to a pumping system.

8. The substrate processing chamber of claim 1, further comprising a stop bar attached to a sidewall of the chamber body, wherein the at least one extension bar has at least one notch configured to mate with the stop bar.

9. The substrate processing chamber of claim 1, wherein the substrate processing chamber is a plasma enhanced chemical vapor deposition chamber.

10. The substrate processing chamber of claim 1, wherein the first end of the ground strap comprises a first mounting flange that is coupled with a connection assembly coupled with a lower side of the substrate support.

11. The substrate processing assembly of claim 10, wherein the connection assembly comprises:
   an L-shaped top piece, and
   a flat bottom plate, wherein the first mounting flange is disposed between the L-shaped top piece and the flat bottom plate.

12. The substrate processing chamber of claim 11, wherein the second end of the ground strap comprises a second mounting flange that is secured to the chamber bottom between the chamber bottom and a bottom clamp.

13. The substrate processing chamber of claim 1, wherein the support body has a plurality of holes disposed therethrough with a plurality of lift pins disposed in the plurality of holes.

14. The substrate processing chamber of claim 13, wherein the plurality of lift pins does not pass through the wide RF ground strap.

15. The substrate processing chamber of claim 14, wherein the length of the ground strap from the first end to the second end is between about 60 cm and about 70 cm.

16. The substrate processing chamber of claim 15, wherein the slot begins between about 10 cm and about 20 cm from the first end and extends through the bend and ends between about 10 cm and about 20 cm from the second end.

17. A substrate processing chamber, comprising:
a chamber body comprising:
   a chamber bottom; and
   a sidewall;
a substrate support comprising a support body, wherein the substrate support is disposed in the chamber body; and
at least one wide RF ground strap comprising:
   a first end coupled to the substrate support;
   a second end coupled to the chamber bottom;
   at least one bend located between the first end and the second end;
   a first flexure extending from the at least one bend toward the first end; and
   a second flexure extending from the at least one bend toward a second end, wherein the wide RF ground strap has a slot extending from the first flexure through the bend into the second flexure.

18. The substrate processing chamber of claim 17, wherein the sidewall has a slit valve and the distance between at least a portion of the ground strap and the sidewall is less than a distance between the support body and the sidewall.

19. The substrate processing chamber of claim 17, wherein the wide RF ground strap is between about 1 cm and about 10 cm wide.

20. The substrate processing chamber of claim 19, wherein the wide RF ground strap is about 4.7 cm wide.

21. The substrate processing chamber of claim 17, wherein the first end of the ground strap comprises a first mounting flange that is coupled with a connection assembly coupled with a lower side of the substrate support.

22. The substrate processing chamber of claim 21, wherein the connection assembly extends outward from the substrate support and substantially parallel to the at least one bend in the ground strap.

23. The substrate processing chamber of claim 17, wherein the support body has a plurality of holes disposed therethrough with a plurality of lift pins disposed in the plurality of holes.

24. The substrate processing chamber of claim 23, wherein the plurality of lift pins does not pass through the wide RF ground strap.

* * * * *